United States Patent
Rauschmayer et al.

(10) Patent No.: US 9,716,955 B1
(45) Date of Patent: Jul. 25, 2017

(54) DEVICE FOR MONITORING A SOUND PRESSURE LEVEL

(71) Applicant: RevX Technologies, Austin, TX (US)

(72) Inventors: Dennis Rauschmayer, Plano, TX (US); James Kim, Allen, TX (US)

(73) Assignee: REVX TECHNOLOGIES, Austin, TX (US)

(*) Notice: Subject to any disclaimer, the term of this patent is extended or adjusted under 35 U.S.C. 154(b) by 0 days.

(21) Appl. No.: 15/079,710

(22) Filed: Mar. 24, 2016

(51) Int. Cl.
H04R 29/00 (2006.01)
A61F 11/06 (2006.01)
H04R 3/04 (2006.01)
G08B 21/18 (2006.01)
H04R 5/04 (2006.01)

(52) U.S. Cl.
CPC ......... H04R 29/001 (2013.01); G08B 21/182 (2013.01); H04R 3/04 (2013.01); H04R 5/04 (2013.01); *H04R 2225/61* (2013.01)

(58) Field of Classification Search
CPC ..... A61F 11/08; A61F 2011/145; G01H 3/14; G10K 11/1788; H03F 1/52; H03F 2200/331; H03G 11/00; H04N 11/00; H04R 1/1008; H04R 1/1016; H04R 1/1041; H04R 1/1066; H04R 1/1083; H04R 2420/07; H04R 29/00; H04R 3/00; H04R 3/0005; H04R 3/007; H04R 5/033; H04R 5/0335; H04R 5/04; H04S 7/40
USPC .................. 381/55, 56, 58, 72, 74, 182, 370
See application file for complete search history.

(56) References Cited

U.S. PATENT DOCUMENTS

| | | | |
|---|---|---|---|
| 9,516,443 B2 * | 12/2016 | Risberg | H04R 3/002 |
| 2004/0240684 A1 | 12/2004 | Cerasuolo et al. | |
| 2005/0013455 A1 * | 1/2005 | Loeb | H04R 19/005 |
| | | | 381/191 |
| 2005/0061770 A1 * | 3/2005 | Neumann | H04R 19/005 |
| | | | 216/13 |
| 2005/0190931 A1 | 9/2005 | Hsieh | |
| 2005/0260985 A1 | 11/2005 | Rader et al. | |
| 2007/0230715 A1 | 10/2007 | Ingemi et al. | |
| 2010/0027807 A1 * | 2/2010 | Jeon | H03G 7/002 |
| | | | 381/74 |
| 2010/0150378 A1 * | 6/2010 | Lee | H03G 7/002 |
| | | | 381/104 |
| 2013/0177173 A1 | 7/2013 | Driessens et al. | |
| 2014/0010390 A1 * | 1/2014 | Zhang | H04N 5/765 |
| | | | 381/309 |
| 2014/0153758 A1 * | 6/2014 | Siegumfeldt | H04R 25/502 |
| | | | 381/317 |

(Continued)

OTHER PUBLICATIONS

Office action for U.S. Appl. No. 15/080,042, mailed on Feb. 1, 2017, Rauschmayer et al., "Device for Providing Customized Audio", 13 pages.

*Primary Examiner* — Khai N Nguyen
(74) *Attorney, Agent, or Firm* — Michael Best & Friedrich LLP

(57) ABSTRACT

Devices for monitoring a sound pressure level of sound generated by a speaker. For example, the device may sample voltages at various points along a path of an audio signal, determine a current associated with the audio signal, and receive or infer an efficiency of the speaker. The device may then determine the sound pressure level based on the voltage, the current, and the efficiency to more accurately monitor the sound pressure level exposure of a user.

20 Claims, 13 Drawing Sheets

(56) References Cited

U.S. PATENT DOCUMENTS

| | | |
|---|---|---|
| 2014/0301588 A1 | 10/2014 | Glover |
| 2015/0263688 A1* | 9/2015 | Nicolino, Jr. ............ H03G 3/32 |
| | | 381/57 |
| 2015/0304774 A1* | 10/2015 | Ambrose ................ H04R 1/10 |
| | | 381/74 |
| 2016/0007109 A1 | 1/2016 | Neumeyer et al. |
| 2016/0192065 A1* | 6/2016 | Oosato ................ H04R 1/1016 |
| | | 381/378 |
| 2016/0295315 A1* | 10/2016 | Kuwahara ............ H04R 1/1016 |
| 2016/0365082 A1* | 12/2016 | Poulsen ............. G10K 11/1786 |

* cited by examiner

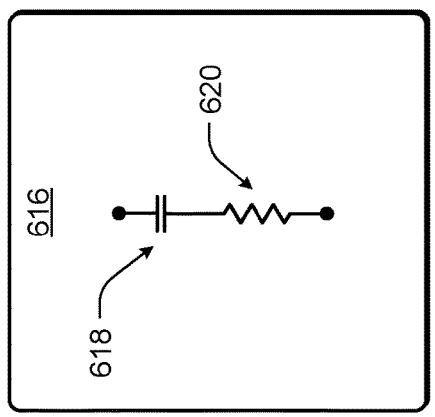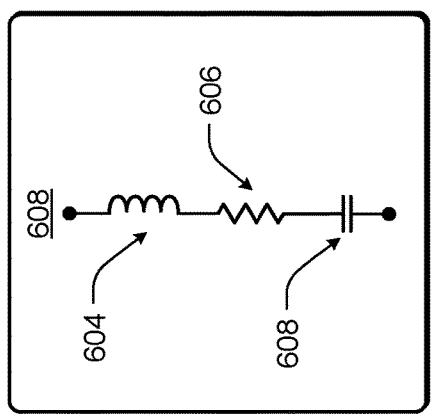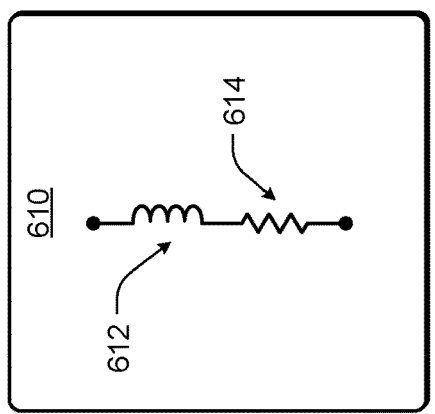
FIG. 6

DEVICE FOR MONITORING A SOUND PRESSURE LEVEL

BACKGROUND

Exposure to audio signals at greater and greater amplitudes through the use of headphones and media devices, such as cell phones and MP3 players, has been increasing at an alarming rate. Exposure to audio signals at high decibel levels has been determined to be one of the primary causes of temporary and permanent hearing impairment, sometimes called noise-induced hearing loss. However, hearing impairment is not only increasing in the general population, but is increasing at a significantly faster rate among young people, especially in among those who utilize media devices and wear headphones (or wireless earpieces) for significant amounts of time.

The extent of hearing damage sustained through exposure to sounds has been determined to be a function of both the amplitude and the duration of the audio signals, and particularly exposure to audio signals at amplitudes that exceed a safe acoustic threshold. Permanent hearing damage is a cumulative effect of exceeding the minimum thresholds or safe pressure levels for extended periods. Various administrative bodies (such as the Occupational Safety and Health Administration (OSHA)) and health awareness agencies (such as the National Institute for Occupational Safety and Health (NIOSH)) have adopted guidelines for safe acoustic levels and listening durations

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 6 illustrates a partial circuit diagram showing a select component to modify the audio signal according to the circuit of FIG. 5.

DETAILED DESCRIPTION

Figure 1:
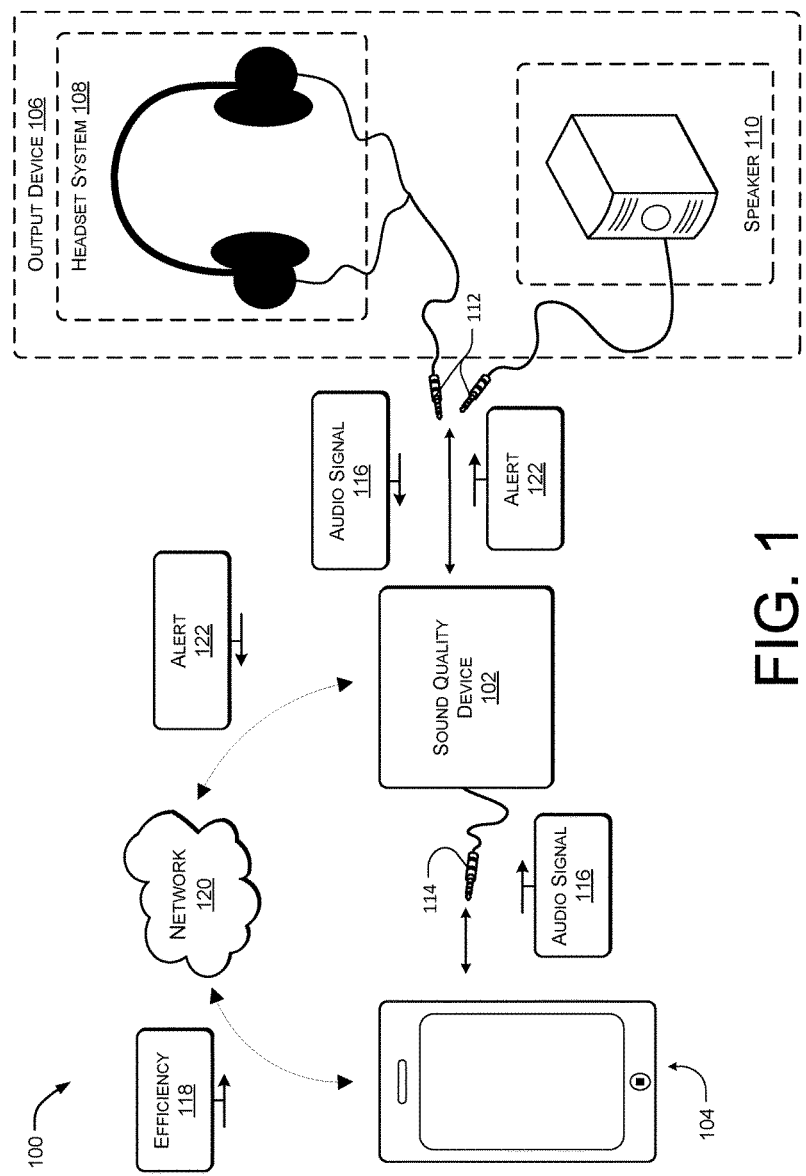
FIG. 1 illustrates an example system including a sound quality device according to some implementations.

This disclosure includes techniques and implementations to improve quality of sound output by speakers, in-ear monitors, or headsets. In particular, this disclosure describes ways to monitor sound pressure level associated with the audio output by a speaker and to alert when hearing damage may be occurring. For example, studies indicate that sustained exposure to noise levels in excess of 85 weighted decibels (dBA) and/or short and loud noises above a peak threshold (e.g., approximately 140 dBA) can permanently damage hearing. Further, OSHA has defined noise level exposure limits based on sound pressure over time. For example, OSHA has defined listening to sound or music over 90 dBA for more than eight hours within a 24 period to cause permeant damage.

Described herein are implementations of a sound quality device that may be coupled between an audio source and an output device (e.g., a speaker) that may monitor the sound pressure level of the sound generated by the output device in real time and notify the user if the sound pressure level presents a danger to the user's hearing. In some particular implementations, the sound quality device may also reduce or lower the sound pressure level.

In general, sound pressure level is a result of the current of the audio signal, the voltage of the audio signal, and the efficiency of the speaker that outputs the audio. However, in many cases, the audio source is associated with a different device or product than the speaker (e.g., a smart phone or audio player versus a headset or earbud system). In these cases, the audio source may be aware of the voltage level but not the current or efficiency, while the output device may be aware of the efficiency but not the voltage or current. Thus, in these cases, calculating and/or monitoring the sound pressure level may be difficult.

In one example, the sound quality device may be configured to measure the voltage and current associated with the audio signal as the single passes through the sound quality device. The sound quality device may in some cases calculate the sound pressure level using the sampled voltage, the calculated or measured current, and an estimated efficiency. In this example, by measuring both the current and voltage the estimated sound pressure level may be more accurate than when merely the voltage is known. Likewise, the estimated sound pressure level may be more accurate than when merely the efficiency is known.

In one particular implementation, the sound quality device may include a path or circuit that includes a known resistive value (e.g., a resistor or series of resistors placed in the path). The sound quality device may sample the voltage of the audio signal at a first point on the path before the known resistive value and a second point on the path after the known resistive value. The sound quality device may then calculate both the current and the current using the two sampled values. For example, the voltage is the voltage at the second point and the current may be equal to the voltage at the second point minus the voltage at the first point divided by the known resistive value.

In some cases, the sound quality device may estimate the impedance of the speaker or earbud by causing the audio source to emit a known or expected tone or audio signal which may be used to calculate the voltages at the first and second points on the path. Using the two voltages, and the known resistive value between the first and second points, the current value can be calculated. Further, by dividing the voltage and the second point by the current, the impedance of the speaker or earbud can be calculated.

Additionally, in some examples, each of the measured voltages may include a series of measured voltages. For instance, the audio source may generate a signal representative of a sine wave. The sound quality device may then take a series of voltage measurements at the first point and a series of voltage measures at the second point. The sound quality device may then take the root mean square of the voltages measured at the first point to determine the first voltage and the root mean square of the voltage measured at the second point to determine the second voltage. The first and second voltages may then be utilized to calculate the current, impedance, and/or sound pressure level.

In some examples, the efficiency may be estimated to be a static value based at least in part on an average efficiency or a threshold efficiency. For instance, the efficiency by be set to ten percent, twenty percent, or even thirty percent. In other examples, the efficiency of the speaker may also be known or obtained by the sound quality device. For example, the audio source may be a smart phone or other user interactive device. The audio source may store an application that may be utilized by a user of the audio source to select or enter information associated with the speaker being used. In one instance, the user may enter a make and model of the speaker or headset and the application operation on the audio source may look up the efficiency in a look up table stored on the audio source or via one or more networks (such as the Internet®).

In some examples, the sound quality device may be configured to notify the user to any risk of permanent hearing damage caused by over exposure to sound based OSHA or other guidelines. For example, the sound quality device may include multiple paths each having a different resistive value associated thereto. The sound quality device may be configured to switch between the resistive paths to cause a clicking or noticeable change in the sound output by the speaker to alert the user to the potential for hearing damage. In other examples, the sound quality device may cause the audio source to generate an alert for the user. For instance, the sound quality device may cause the audio source to vibrate, glows, activate a light, turn on, turn off, present a notification on the display, etc.

In other cases, the sound quality device may be configured to increase or decrease the resistive value that the audio signal passes through based on the sound pressure level experienced by the user. For instance, the sound quality device may switch to a path having a higher overall resistance to reduce the voltage and/or current associated with the audio signal output as sound, thereby reducing the sound pressure level without requiring a change in the volume level at the audio source.

In one particular example, the sound quality device may act as a scream protection device. For instance, when switching audio signals (e.g., when switching from audio generated by an streaming application hosted on the audio source to audio from a music player application on the audio source) the volume level associated with the audio signal may differ. In these cases, the sound quality device may switch to a high resistive path for a predetermined amount of time upon the activation of the device, receiving a new or different audio signal, or at any time the sound pressure level exceeds a threshold. In this manner, when the audio source is first turned on the user may be protected from an exceptionally loud noise being output at the speaker due to the volume being left in an elevated state when the audio device was deactivated. Similarly, the user hearing may be protected if the volume on the audio signal is suddenly increased, for instance as is common, during an explosion on an audio track associated with a movie or television show.

FIG. 1 illustrates an example system 100 including a sound quality device 102 according to some implementations. In the illustrated example, the sound quality device 102 is shown as a separate device that may couple between an audio source 104 and an output device 106, such as the headset 108 (ear buds) or the speaker 110. For example, the output device 106 may couple to the sound quality device 102 via a TRS jack or other type of audio input 112 and the sound quality device 102 may also couple to the amplifier 104 via a TRS jack or other type of audio input 114.

In some cases, the sound quality device 102 may include an audio path including a known restive value. The sound quality 102 device may be configured to sample the voltage of the audio signal 116 at a first point on the path before the known resistive value and a second point on the path after the known resistive value. In some cases, sound quality device may sample a series of voltages at the first point and a series of voltages at the second point. The sound quality device may determine the voltage at the first point based at least in part on a root mean square of the series of voltages sampled at the first point and the voltage at the second point based at least in part on the root mean square of the series of voltage sampled at the second point.

The sound quality device 102 may calculate both the voltage and the current using the two sampled values. For example, the voltage may be the voltage at the second point (e.g., the voltage received by the output device 106) and the measured current may be equal to the voltage at the second point minus the voltage at the first point divided by the known resistive value.

In some examples, an efficiency 118 may be a static value based at least in part on an average efficiency or a threshold efficiency. For instance, the efficiency 118 by be set to ninety five percent, ninety eight percent, or even ninety nine percent of the output device 106. In other examples, such as the illustrated example, the efficiency 118 of the output device 106 may also be known or obtained by the sound quality device 102. For example, the sound quality device 102 may be in communication with the audio source 104 via a network 120 (e.g., a short range wireless communication network, such as Bluetooth®). The audio source 104 may then store a sound quality application that may be utilized by a user of the audio source 104 to select or enter information associated with the output device 106 being used. In one instance, the user may enter a make and model of the speaker or headset and the sound quality application operation on the audio source 104 may look up the efficiency 118 in a look up table stored on the audio source 104 or via one or more networks (such as the Internet®) and provide the efficiency 118 to the sound quality device 102.

In some examples, the sound quality device 102 may be configured to alert 122 the user to any risk of permanent hearing damage caused by over exposure to sound based OSHA or other guidelines. In one implementation, the sound quality device 102 may include multiple paths each having a different resistive value associated thereto. The sound quality device 102 may be configured to switch between the resistive paths to cause a clicking or noticeable change in the sound output by the speaker to alert 122 the user to the potential for hearing damage. In other examples, the sound quality device 102 may provide an indication of the alert 122 to the audio source 104 to cause the audio source 104 to notify the user. For instance, the audio source 104 may vibrate, glows, activate a light, turn on, turn off, present a notification on the display, etc. in response to receiving the indication of the alert 122 form the sound quality device 102.

Figure 2:
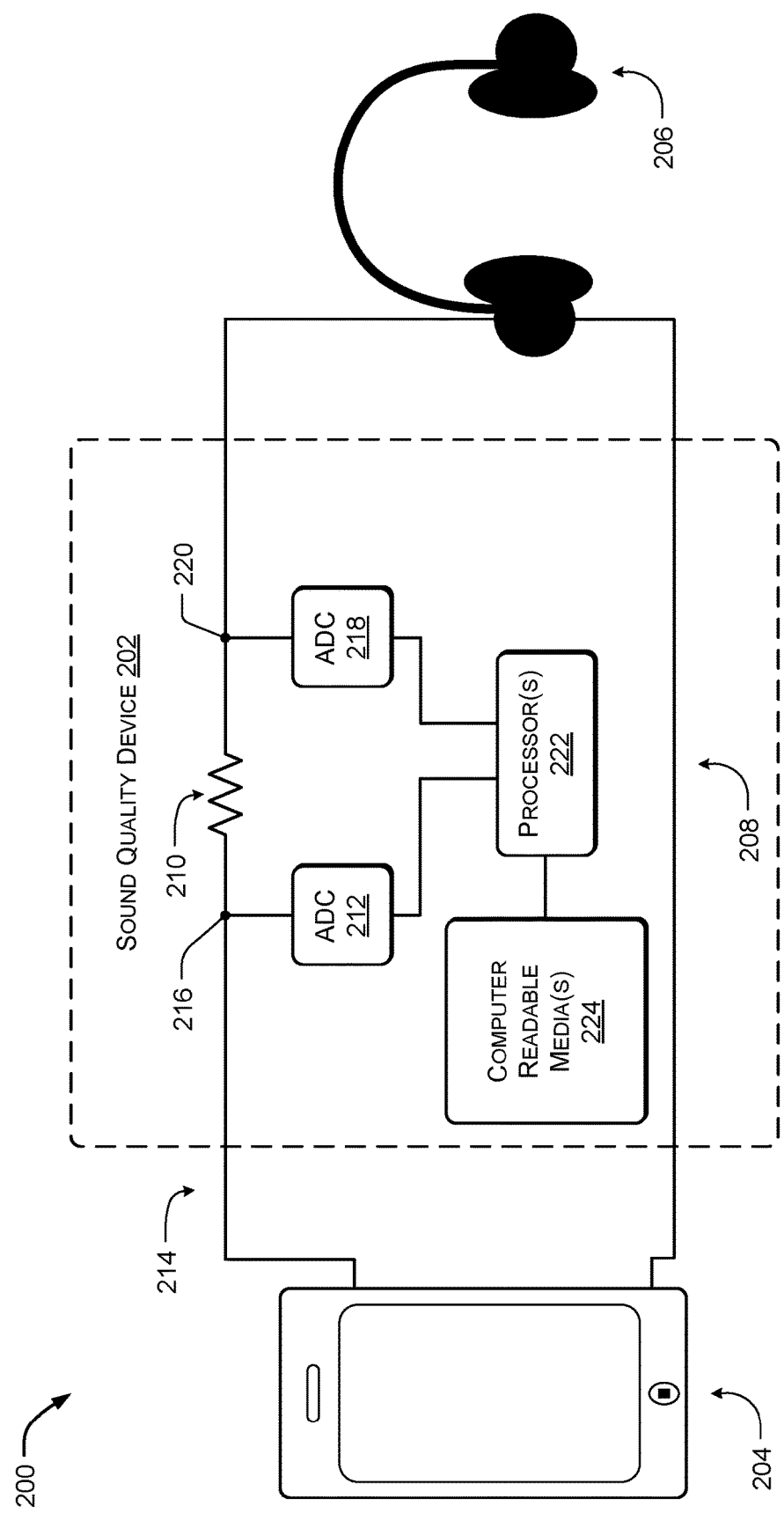
FIG. 2 illustrates a partial circuit diagram showing select components of a sound quality device of a system according to some implementations.

FIG. 2 illustrates a partial circuit diagram showing select components of a sound quality device 202 of a system 200 according to some implementations. In the illustrated example, the sound quality device 202 is coupled between an audio source 204 and the output device 206 and includes, in part, a circuit 208 between the audio source 204 and the output device 206 to facilitate the output of an audio signal generated by the audio source 204 as sound by the output device 206.

The circuit 208 includes at least one resistive value 210. The restive value 210 may be the resistive value of the routing wire between points 216 and 220 and/or an additional resistive element introduced into the path 214 between the points 216 and 220. The circuit 208 may also include a first analog to digital converter 212 coupled on a path 214 of the audio signal from the audio source 204 to the output device 206 at a point 216. The circuit also includes a second analog-to-digital converter 218 coupled to the path 214 at a point 220. Both the first analog-to-digital converter 212 and the second analog-to-digital converter 218 may be further coupled to one or more processors 222 for determining a voltage at the output device 206 and a current at output device 206.

In one example, the processors 222 may receive a first sample of the voltage of the audio signal at the point 216 via the analog-to-digital converter 212 and a second sample of the voltage of the audio signal at the point 220 via the analog-to-digital converter 218. The processor 222 may then calculate the current of the audio signal at the output device 206 by subtracting the voltage sampled at the first point from the voltage sampled at the second point and dividing the result by the resistive value 210.

Once the current is measured or calculated, the processors 222 may calculate the sound pressure level by multiplying the voltage sampled at the point 220 by the current calculated above and a value indicative of the efficiency of the output device 206. In some cases, the processor 222 may obtain or request the efficiency from the computer readable media 224.

Figure 3:
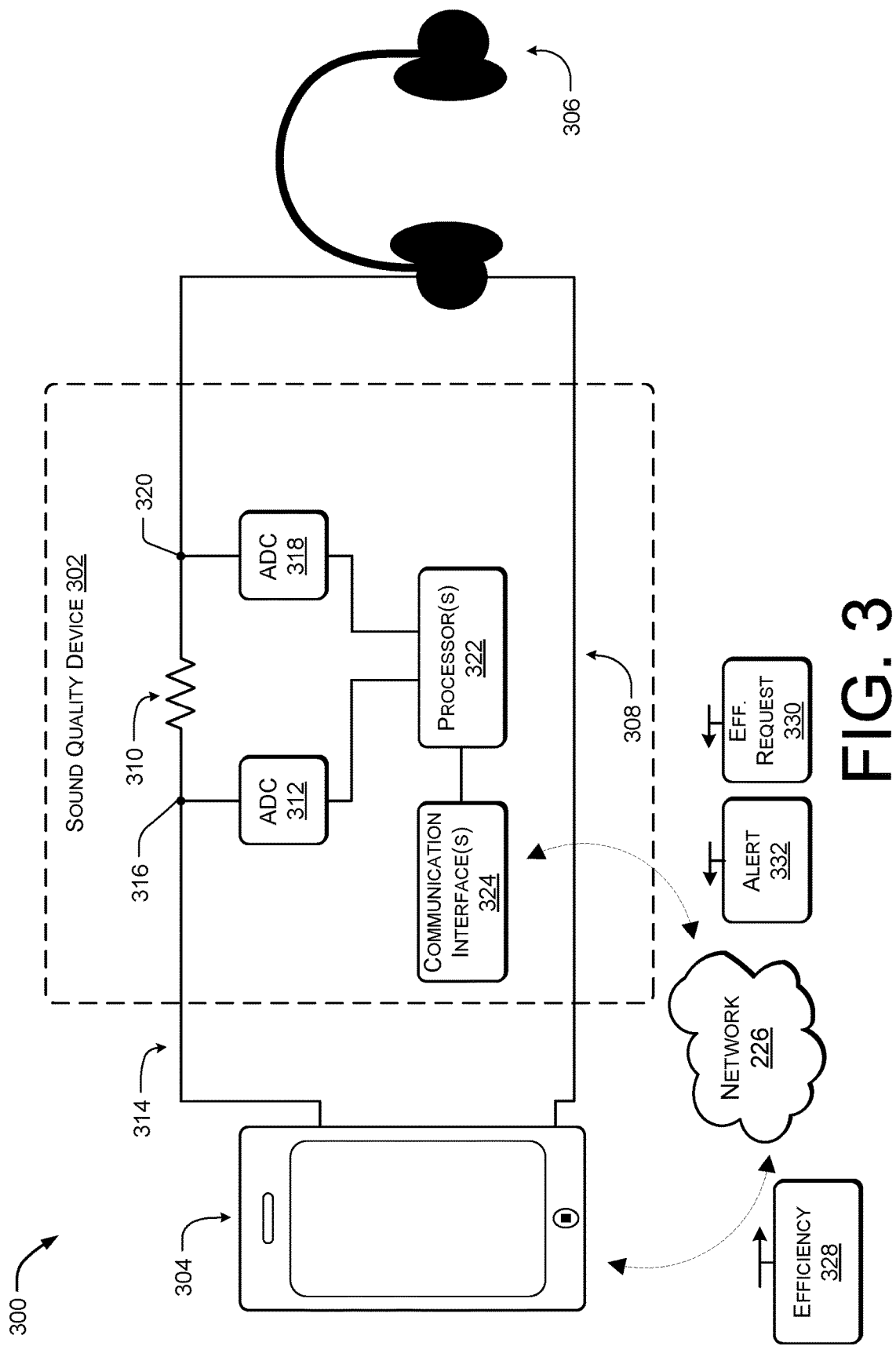
FIG. 3 illustrates a partial circuit diagram showing select components of a sound quality device of a system according to some implementations.

FIG. 3 illustrates a partial circuit diagram showing select components of a sound quality device 302 of a system 300 according to some implementations. In the illustrated example, the sound quality device 302 is coupled between an audio source 304 and the output device 306 and includes, in part, a circuit 308 between the audio source 304 and the output device 306 to facilitate the output of an audio signal generated by the audio source 304 as sound by the output device 306.

The circuit 308 includes at least one resistive value 310 having a known resistive value 310. The restive value 310 may be the resistive value of the routing wire between points 316 and 320 and/or an additional resistive element introduced into the path 314 between the points 316 and 320. The circuit 308 may also include a first analog to digital converter 312 coupled on a path 314 of the audio signal from the audio source 304 to the output device 306 at a point 316. The circuit also includes a second analog-to-digital converter 318 coupled to the path 314 at a point 320. Both the first analog-to-digital converter 312 and the second analog-to-digital converter 318 may be further coupled to one or more processors 322 for determining a sound pressure level of the sound generated by the output device 306.

In some cases, the processor 322 may be coupled one or more communication interfaces 324 for sending and receiving data from the audio device 304 over one or more networks 326. In some cases, the network 326 may be representative of wired technologies (e.g., wires, USB, fiber optic cable, etc.), wireless technologies (e.g., RF, cellular, satellite, Bluetooth, etc.), or other connection technologies. The network 326 may be representative of any type of communication network, including data and/or voice network, and may be implemented using wired infrastructure (e.g., cable, CAT5, fiber optic cable, etc.), a wireless infrastructure (e.g., RF, cellular, microwave, satellite, Bluetooth, etc.), and/or other connection technologies. The network 326 may carry data (for example, efficiency values 328) between the sound quality device 302 and the audio source 304.

In one example, the processors 322 may receive a first sample of the voltage of the audio signal at the point 316 via the analog-to-digital converter 312 and a second sample of the voltage of the audio signal at the point 320 via the analog-to-digital converter 318. The processor 322 may then calculate the current of the audio signal at the output device 306 by subtracting the voltage sampled at the first point from the voltage sampled at the second point and dividing the result by the resistive value of the resistive value 310.

Once the current is measured or calculated, the processors 322 may calculate the sound pressure level by multiplying the voltage sampled at the point 320 by the current calculated above and a value indicative of the efficiency of the output device 306. In some cases, the processor 322 generates an efficiency request 330 and cause the communications interfaces 324 to send the request 330 to the audio source 304. In some cases, the efficiency request 330 may include an impedance value calculated by the processor 322 by dividing the voltage sampled at the point 320 by the voltage sampled at point 316 minus the voltage sampled at the point 320. In other cases, the request 330 may include the sampled voltages and/or the calculated current, such that the audio source 304 may calculate the efficiency 328 and/or impedance.

In one particular implementation, the request 330 may include the sampled voltages and the audio source 304 may be configured to calculate the sound pressure level based on the sampled voltages, to monitor the sound pressure level over time, and to provide the alert 330 to the user in response to determining the output device 306 is causing damage. For example, the audio source 304 may vibrate, emit a noise, activate the display, and cause a notification to appear on the display, or otherwise alter the user. In other cases, the sound quality device 302 may determine the user should be altered and, thus, the processors 322 may generate the alert 332 and cause the communication interfaces 324 to provide the alert 322 to the audio source 304 for output to the user.

Figure 4:
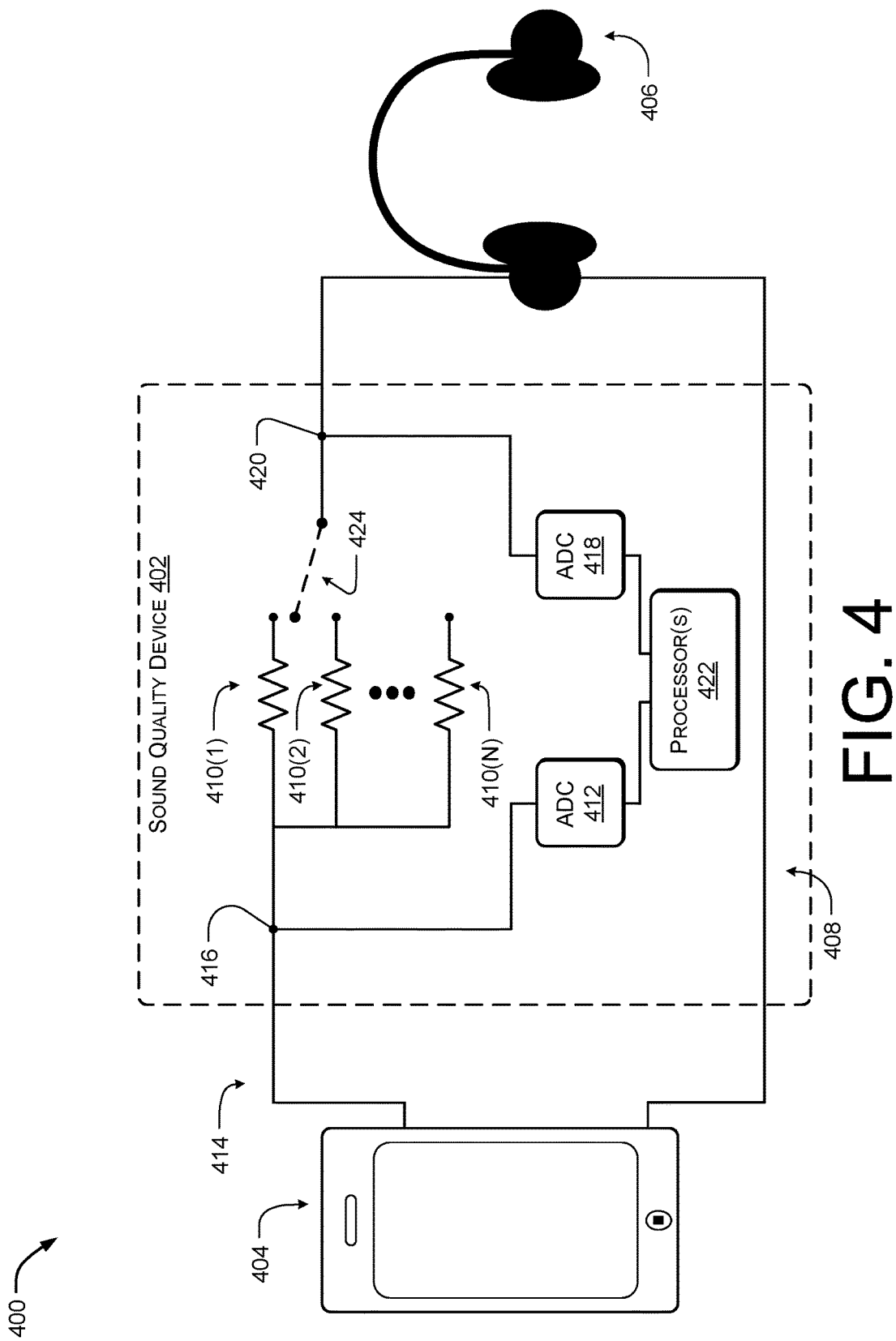
FIG. 4 illustrates a partial circuit diagram showing select components of a sound quality device according to some implementations.

FIG. 4 illustrates a partial circuit diagram showing select components of a sound quality device 402 of a system 400 according to some implementations. The sound quality device 400 may be configured to couple inline between an audio source 404 and an output device 406. In the illustrated example, the sound quality device 302 includes, in part, a circuit 408 between the audio source 404 and the output device 406 to facilitate the output of an audio signal generated by the audio source 404 as sound by the output device 406.

The circuit 408 includes a plurality of resistive elements, generally indicated by 410(1)-(N), along the path 414. Each of the restive elements 410 may provide a different resistive value to the path 414 between the points 416 and 420. The circuit 408 may also include a first analog to digital converter 412 coupled on a path 414 of the audio signal from the audio source 404 to the output device 406 at a point 416. The circuit also includes a second analog-to-digital converter 418 coupled to the path 314 at a point 420. Both the first analog-to-digital converter 412 and the second analog-to-digital converter 418 may be further coupled to one or more processors 422 for determining a sound pressure level of the sound generated by the output device 406.

Once the current is measured or calculated, the processors 422 may calculate the sound pressure level by multiplying the voltage sampled at the point 420 by the current calculated above and a value indicative of the efficiency of the output device 406. In some cases, the processor 422 calculate the sound pressure level using a predetermined or static efficiency value. In some cases, the processor 422 may determine that the sound pressure level is too high or may be causing damage as the duration of listing at the current sound pressure level has overexposed the user. In these cases, the processor 422 may alert the user by causing a switch 424 or other control mechanism to change the resistive value by switching restive element within the path 414 between points 416 and 420. For example, the processor 422 may cause the switch 424 to switch the restive value 410(1)-(N) a predetermined number of times within a given period of time to alter the user by causing the output device 406 to output a clicking noise or other predetermined sound in response to the change in resistance.

In some implementations, the processor 422 may cause the switch 424 to increase the resistive value of the path 414 between the points 416 and 420 in response to determining that the sound pressure level is indicative of potential permanent hearing damage. By increasing the resistance on the path 414 between the audio source 404 and the output device 406, the sound pressure level may be reduced at the output device 406 without a corresponding reduction in volume at the audio source 404. Thus, the sound quality device 402 may both monitor the sound pressure level at the output device 406 and maintain the sound pressure level at a safe level even during extended periods of listening.

In some examples, the processor 422 may cause the switch 424 to apply a resistive element 410 to the path 414 based in part on the measured voltage, the calculated current, and/or the sound pressure level. For example, the resistive element 410 may be selected to reduce the sound pressure level to reduce the potential hearing damage to a user.

In one particular implementation, the switch 424 or other control mechanism within the sound quality device 402 may switch to a high resistive element 410 upon activation of the sound quality device 402, activation of the audio source 404, or upon initially receiving an audio signal from the audio source 404. In this manner, the sound quality device 402 may prevent the output of sound having an excessive sound pressure level as a result of an individual turning the audio source 404 off with the volume at a high or above normal level. In some instances, the processor 422 may cause the switch to a resistive element 410 having a lower resistive value over time (e.g., after 3 seconds or 5 seconds) to gradually adjust the sound to the level indicated by the user at the audio source 404. In some particular instances, the processor 422 may cause the switch 424 to adjust the resistive element 410 multiple times before returning to the restive element 410 having the lowest resistive value.

Figure 5:
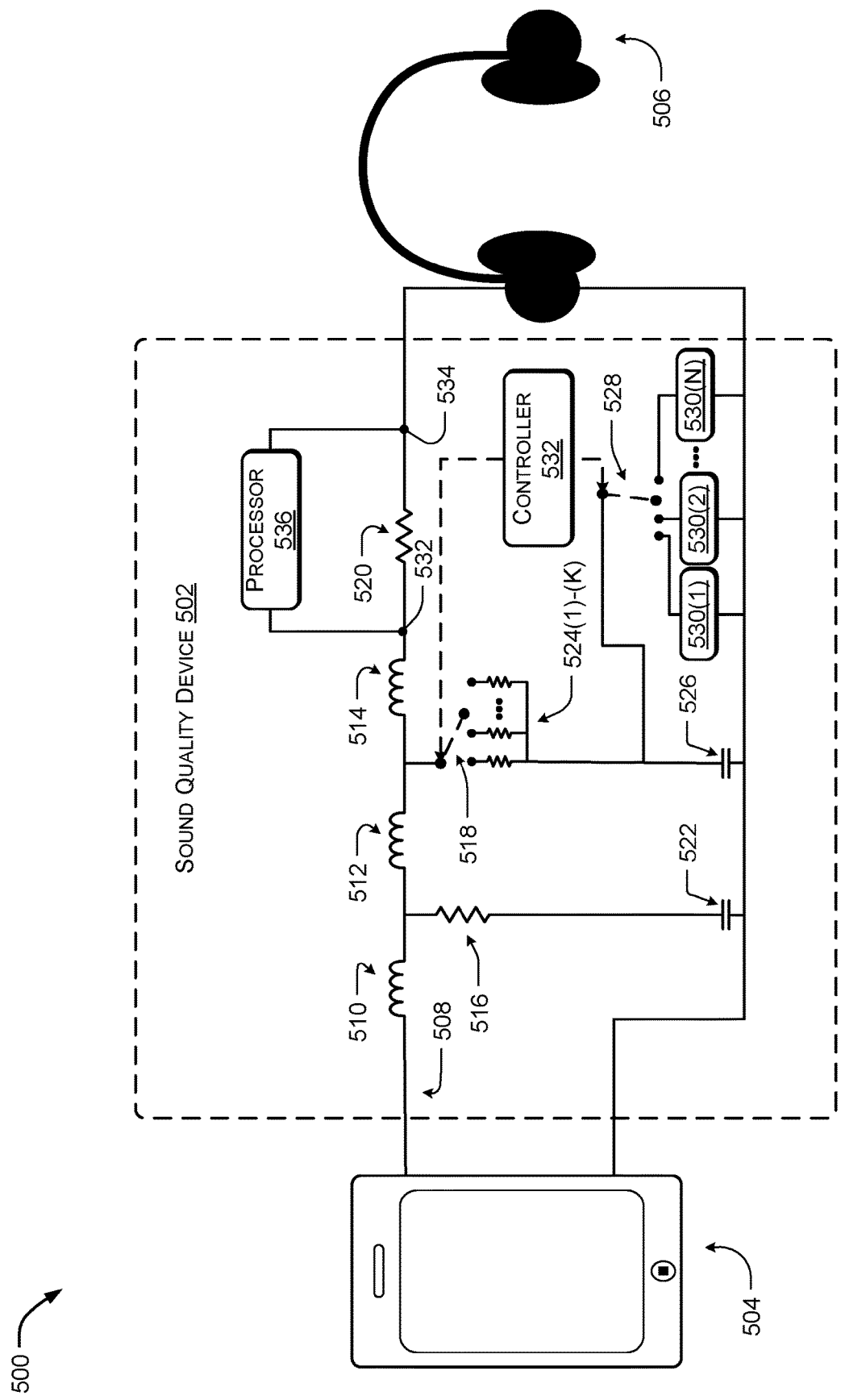
FIG. 5 illustrates a partial circuit diagram showing select components of a sound quality device according to some implementations.

FIG. 5 illustrates a partial circuit diagram 500 showing select components of a sound quality device 502 according to some implementations. In the illustrated example, the sound quality device 502 is coupled between an audio source 504 and an output device 506. For example, the sound quality device 502 may be configured to couple inline between an audio source 504 or other audio producing device and an output device 506 or speaker. In some cases, the interface may be a TRS connector or other audio input that produces the left audio and right audio as separate signals, for instance to produce surround sound.

The sound quality device 502 may include an audio path 508. The path 508 may include a first inductor 510 with a first electrode coupled to a first electrode of a second inductor 512 and a first electrode of a first resistor 516. The second inductor 512 may have a second electrode coupled to a first electrode of a third inductor 514 and a first electrode of a first switch 518. The third inductor 514 may have a second electrode coupled to a first electrode of a second resistor 520.

The first resistor 516 may have a second electrode coupled to a first electrode of a first capacitor 522. The first capacitor 522 may have a second electrode coupled to ground or a common terminal (not shown) of the audio source 504. The first switch 518 may have a second electrode that is releasably coupled to a first electrode of one of a plurality of resistive elements, generally indicated by 524(1)-(K). Each of the plurality of resistive elements 524 may have a second electrode coupled to a first electrode of a second capacitor 526 and a first electrode of a second switch 528. The second capacitor 526 may have a second electrode coupled to ground or the common terminal (not shown) of the audio source 504. The second switch 528 may have a second electrode that is releasably coupled to a first electrode of one of a plurality of audio modification components, generally indicated by 530(1)-(N).

In some implementations, a controller 538 may be configured to provide a control signal to the switch 518 to cause the switch 518 to select a restive element 524(1)-(K). Likewise, the controller 538 may also be configured to provide a control signal to the switch 528 to cause the switch 528 to couple to a particular one of the audio modification components 530(1)-(N). In other implementations, the processor 536 may be configured to provide the control signals to either of the switches 518 or 528.

In the illustrated example, the inductors 512-514 and capacitors 522 and 526 may act to impede the distortion introduced by the output device 506 and environmental noise captured by the output device 506 from feeding back into the audio source 504. The inductors 512-514 and capacitors 522 and 526 may also act to filter the ultrasonic frequencies from the audio signal generated by the audio source 504.

Additionally, the plurality of resistive elements 524(1)-(K) may be utilized to further improve the frequency response, while maintain a predetermined level of distortion rejection, noise rejection and/or microphonic rejection. In some cases, the switch 518 may be configured to couple to one of the resistive elements 524(1)-(K) to provide an frequency response based at least in part on one or more characteristics (e.g., efficiency) of the output device.

For instance, in some situations, harmonic distortion may be generated by the mechanical or the magnetic components of the output device 506 as the audio signal is output as sound. For example, the magnetic components may generate frequencies or overtones that are not part of the original audio signal based on a position of the mechanical (or moving) components of the output device 506 in relation to the magnetic components. In some instances, the harmonic distortion may be output by the speakers of the output device 506. In other cases, the output device 506 may generate intermodulation distortion as the magnetic components interact with the mechanical components. The intermodulation distortion may present itself as a mixing of the original audio signal, which generates additional frequencies or sounds that are detectable by the human ear.

Additionally, in some situations, environmental noise may also be coupled with the audio signal as the output device 506 may act, at least in part, as a microphone. For example, the in-ear monitors worn by musicians when on stage to attenuate the volume of the music and protect the musician's ears often acts as microphone that detects and transfers environmental sound (e.g., stage and audience noise) back into the amplifiers, which may then be coupled into the audio signal.

In general, one or more of the harmonic distortion, the intermodulation distortion, and/or the environmental noise may be coupled back to the audio source 504 as feedback. In some cases, the audio source 504 may incorporate the feedback into the audio signal as the audio signal is passed to the output device 504. The output device 504 in turn generates sound based on the audio signal including the frequencies associated with the feedback, thereby reducing the quality of the sound generated or causing the output of frequencies that are not part of the original audio signal.

In other situations, the audio source 504 itself may reduce the quality of the sound generated by the speaker. For example, some types of amplifiers, such as electronic amplifier, generate ultrasonic noise. While ultrasonic noise may not be directly detectable by the human ear, the ultrasonic noise may cause the driver of a speaker of the output device 506 to vibrate at the ultrasonic frequencies and couple with the magnetic components of the speaker to introduce irregularities in the sound output by the speaker within the frequencies detectable by the human ear. In some cases, the ultrasonic noise within the audio signal also increases the rate at which the speaker generates harmonic and intermodulation distortion and thereby degrades the sound quality as discussed above.

While, the inductors 510-514 and capacitors 522 and 526 may act to impede the distortion introduced by the output device and environmental noise captured by the output device from feeding back into the amplifier, the plurality of resistors 524(1)-(K) may further aid in the attenuation of the distortion and noise feeding back from the output device. In some cases, the resistors 524(1)-(K) act to flatten the audio signal as the audio signal may be passed to the output device and, thereby to maintain the high end frequencies of the audio signal, while still cutting off the ultrasonic noise.

In some specific examples, the resistive value coupled to the path 508 by the switch 518 may be selected based on characteristic of the output device 506. For example, as discussed above, the user may input identification information (e.g., a make and model) associated with the output device 506 via an application operating on a device, such as the audio source 504. The application may cause the device to provide the identification information to the sound quality device via a communication interface. The sound quality device 504 may then select one of the resistive element 524(1)-(K) to provide an further improved frequency response and distortion rejection.

The plurality of audio modification components 530(1)-(N) may be introduced into the audio path 508 to modify the audio signal prior to audio being output by the output device 506. For example, the audio modification component 530(1) may reduce high range frequencies, while the audio modification component 530(2) may reduce low range frequencies. In some cases, the sound quality device may receive an indication of the hearing capabilities of a user listening to the sound output by the output device 506 and select the audio modification component 530(1)-(K) to apply to the audio signal based at least in part on the hearing capabilities.

The resistor 520 may be a resistor having a known resistive value. The restive value may be the resistive value of the routing wire between points 532 and point 534. In some cases, a first analog to digital converter (not shown) may be coupled to point 532 and a second analog-to-digital converter (not shown) may be coupled to the point 534. Both the first analog-to-digital converter and the second analog-to-digital converter may be further coupled to a processor 536. The processor 536 may calculate or determine a sound pressure level of the sound generated by the output device 506 based at least in part on a series of voltages sampled at the first point 532 and a series of voltages sampled at the second point 534, as described above with respect to FIGS. 1-4.

FIG. 6 illustrates a partial circuit diagram 600 showing a select components 602, 610, and 616 which may be utilized as one or more of the audio modification component 530(1)-(K) of FIG. 5. As described above with respect to FIG. 5, the sound quality device may receive an audiogram, hearing profile, or component selection from an audio source. The sound quality device may then select a component, such as components 602, 610, or 616, to modify the audio signal to provide an improved listening experience for the user that is tailored to the user's hearing loss or capabilities.

In the illustrated example, the component 602 includes an inductor 604 coupled to a first end of a resistive element 606. The resistive element 606 has a second end that coupled to a capacitor 608. In general, the component 602 has the effect of attenuating the middle frequency of the audio signal, while passing the high and low end frequency. Thus, the component 602 provide the equivalent of increasing the volume of the high and low end frequencies with respect to the mid-range frequencies.

In the illustrated example, the component 610 includes an inductor 612 coupled to a first end of a resistive element 614. In general, the component 610 has the effect of boasting the high end frequencies of the audio signal, while passing the mid-range and low-end frequency. Thus, the component 610 provide the equivalent of increasing the volume of the high with respect to the mid-range and low-range frequencies.

In the illustrated example, the component 616 includes an capacitor 618 coupled to a first end of a resistive element 620. In general, the component 616 has the effect of boasting the low end frequencies of the audio signal, while passing the high and mid-range frequency. Thus, the component 610 provide the equivalent of increasing the volume of the low-range frequencies with respect to the mid-range and high-end frequencies.

FIG. 6 provides one example of a component 602 that may be incorporated into the circuit of FIG. 5 to modulate the audio signal to accommodate the user's hearing loss. Thus, it should be understood, that many other components may be incorporated into the circuit of FIG. 5 in addition to or in lieu of the component 602.

FIGS. 7-11 are flow diagrams illustrating example processes associated with the circuits of FIGS. 1-5. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Figure 7:
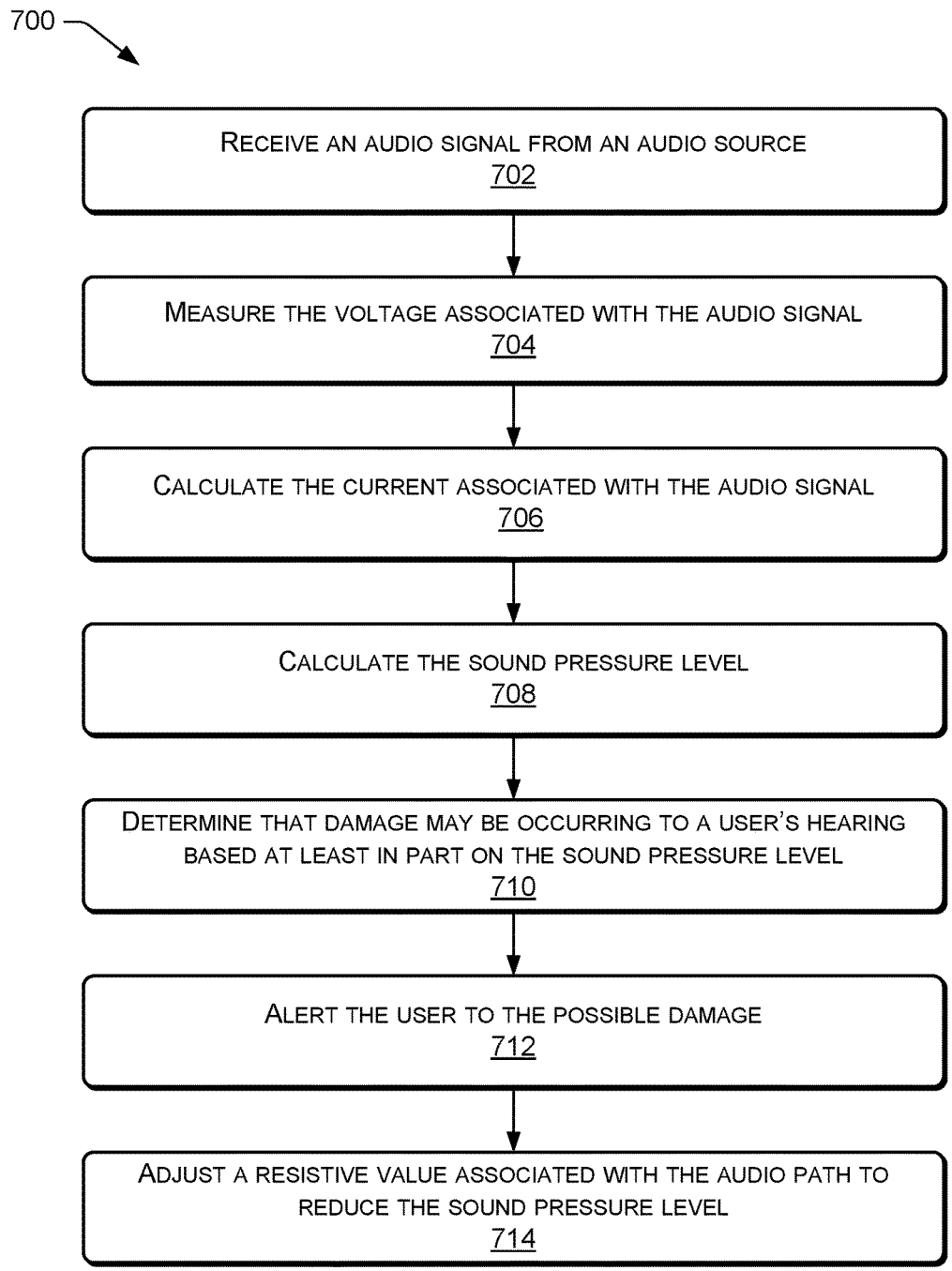
FIG. 7 is an example flow diagram showing an illustrative process according to some implementations.

FIG. 7 is an example flow diagram showing an illustrative process 700 according to some implementations. For instance, a sound quality device may be coupled between an audio source and an output device to monitor the sound pressure level of the sound output by the output device in real time. In some cases, the sound quality device may notify the user if the sound pressure level presents a danger to the user's hearing. In some particular implementations, the sound quality device may also reduce or lower the sound pressure level without assistance from the audio source.

As described above, the sound pressure level is a result of the current of the audio signal, the voltage of the audio signal, and the efficiency of the speaker that outputs the audio. However, in many cases, the audio source is associated with a different device or product than the speaker (e.g., a smart phone or audio player versus a headset or earbud system). In these cases, the audio source may be aware of the voltage level but not the current or efficiency, while the ear bud or speaker may be aware of the efficiency but not the voltage or current. Thus, in these cases, the sound quality device may be coupled between the audio source and the output device to more accurately monitor the sound pressure level associated with the sound output to the user.

At 702, the sound quality device receives an audio signal from the audio source. For example, the sound quality device may be coupled to the audio source via a TRS or USB connection interface. In some cases, the audio signal may include a mono signal or a stereo signal.

At 704, the sound quality device measures the voltages associated with the audio signal. For example, the sound quality device may measure the voltage on each terminal of a resistor of known resistive value through which the audio signal passes. In some cases, the voltage measured at one terminal of the known resistive value may be the voltage used to calculate the sound pressure level of the sound generated by the output device.

At 706, the sound quality device may calculate the current associated with the audio signal. For example, the sound quality device may include a processor that may calculate the current using the two sampled or measured voltages and the known resistive value.

At 708, the sound quality device may calculate the sound pressure level using the voltage measured after the known resistive value and the current. In some cases, the sound quality device may also use an efficiency value of the speaker to more accurately calculate the sound pressure level. In one example, the efficiency may be a static or predetermined value that the sound quality device uses regardless of the output device coupled to the sound quality device.

At 710, the sound quality device determines that damage may be being caused to the user's hearing based at least in part on the sound pressure level. For example, the sound quality device may determine that damage may occur if the sound pressure level is greater than a threshold value. In other cases, the sound quality device may monitor or record the sound pressure level over time and determine that damage may occur when the sound pressure level is above one or more threshold for a predetermined period of time. For example, the sound quality device may monitor the sound pressure level over time based on the OSHA guidelines.

At 712, the sound quality device may alert the user to the potential for hearing damage. For example, the sound quality device may add a predetermined noise or sound to the audio signal prior to providing or sending the audio signal to the output device. Thus, the user may be altered via the noise or sound being generated along with the audio signal by the output device.

At 714, the sound quality device may adjust a resistive value associated with the audio path to reduce the sound pressure level. For example, in lieu of or in addition to alerting the user as to the potential for hearing damage the sound quality device may insert a higher resistive value into the audio path of the audio signal to thereby reduce the sound pressure level of the sound generated by the output device.

Figure 8:
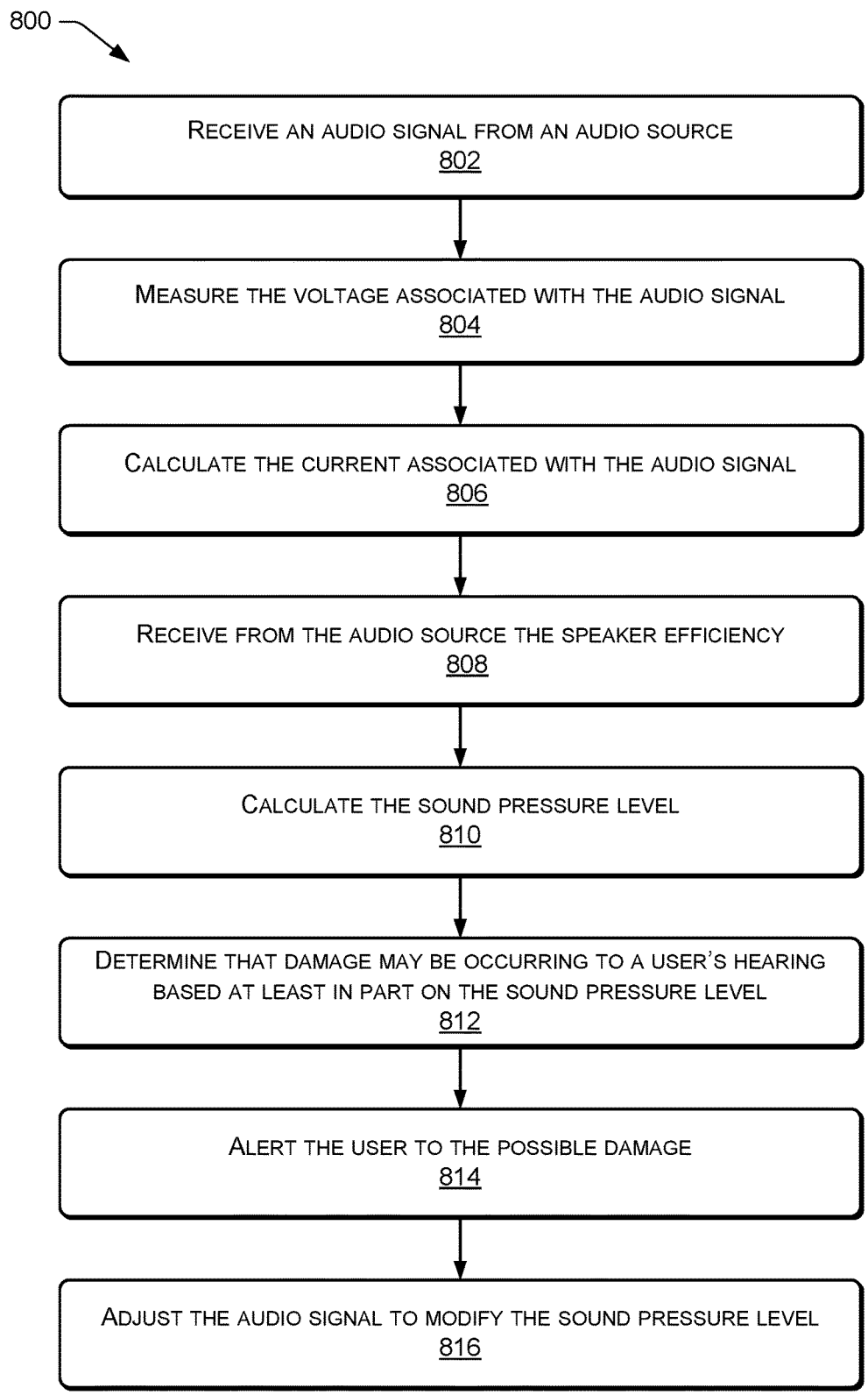
FIG. 8 is an example flow diagram showing an illustrative process according to some implementations.
Figure 9:
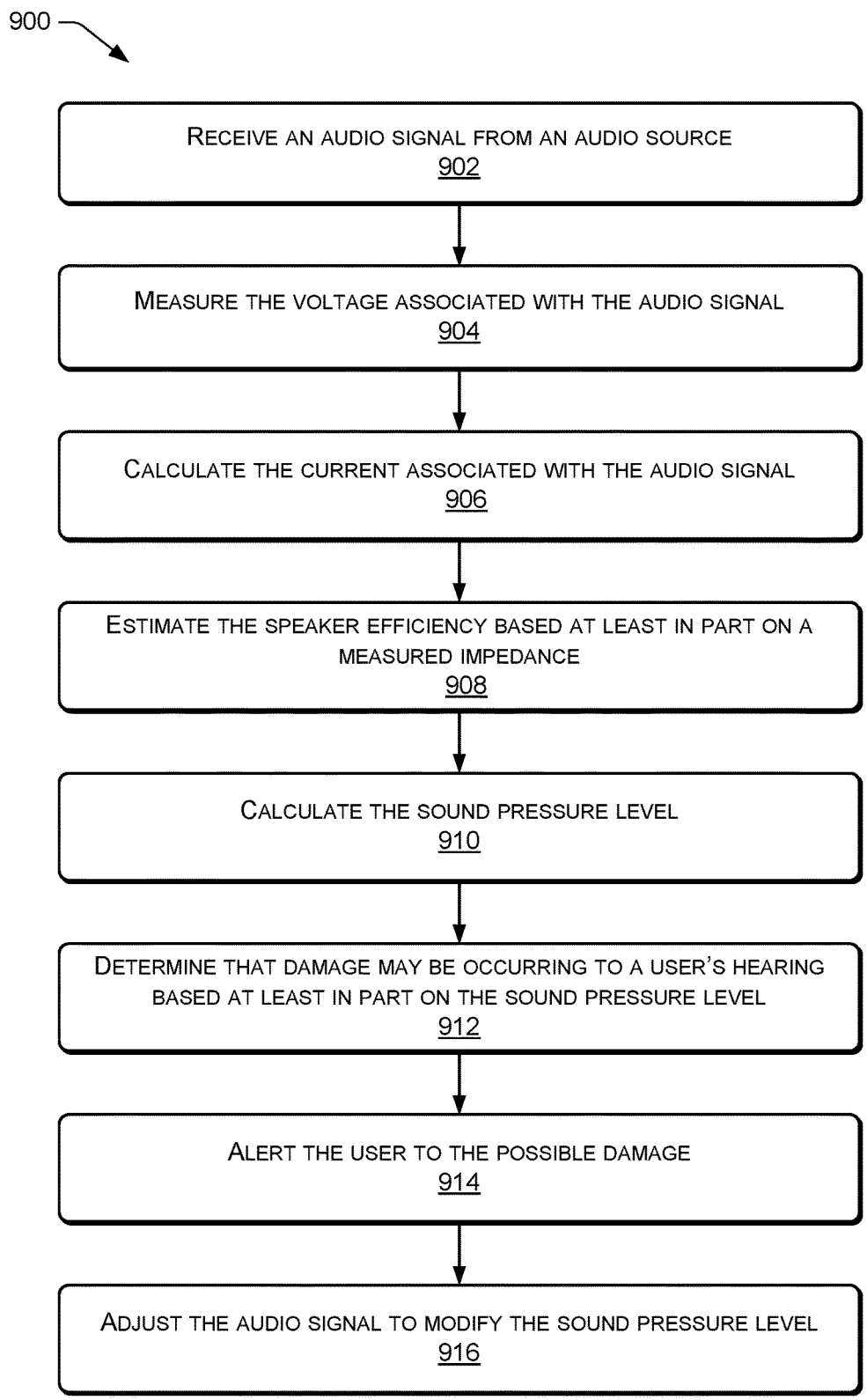
FIG. 9 is an example flow diagram showing an illustrative process according to some implementations.

FIG. 8 is an example flow diagram showing an illustrative process 800 according to some implementations. For instance, a sound quality device may be coupled between an audio source and an output device to monitor the sound pressure level of the sound output by the output device in real time. In some cases, the sound quality device may notify the user if the sound pressure level presents a danger to the user's hearing. In some particular implementations, the sound quality device may also reduce or lower the sound pressure level without assistance from the audio source.

As described above, the sound pressure level is a result of the current of the audio signal, the voltage of the audio signal, and the efficiency of the speaker that outputs the audio. However, in many cases, the audio source is associated with a different device or product than the speaker (e.g., a smart phone or audio player versus a headset or earbud system). In these cases, the audio source may be aware of the voltage level but not the current or efficiency, while the ear bud or speaker may be aware of the efficiency but not the voltage or current. Thus, in these cases, the sound quality device may be coupled between the audio source and the output device to more accurately monitor the sound pressure level associated with the sound output to the user.

At 802, the sound quality device receives an audio signal from the audio source. For example, the sound quality device may be coupled to the audio source via a TRS or USB connection interface. In some cases, the audio signal may include a mono signal or a stereo signal.

At 804, the sound quality device measures the voltages associated with the audio signal. For example, the sound quality device may measure the voltage on each terminal of a resistor of known resistive value through which the audio signal passes. In some cases, the voltage measured at one terminal of the known resistive value may be the voltage used to calculate the sound pressure level of the sound generated by the output device.

At 806, the sound quality device may calculate the current associated with the audio signal. For example, the sound quality device may include a processor that may calculate the current using the two sampled or measured voltages and the known resistive value.

At 808, the sound quality device receives the efficiency value from the audio source. For example, the sound quality device may be in wireless communication with the audio source and a sound quality application may be installed on a computer readable media of the audio source. Using the sound quality application, the user may select the make and model of the output device coupled to the sound quality device. The sound quality application may also include a data related to the efficiency of various or commonly used output devices. In some specific examples, the sound quality device may be in communication with another device other than the audio source that may provide the efficiency. For example, the user may utilize a smart phone or other computing device to enter the efficiency, while the audio source may be stereo system.

At 810, the sound quality device may calculate the sound pressure level using the voltage measured after the known resistive value, the current, and the efficiency received from the audio source.

At 812, the sound quality device determines that damage may be being caused to the user's hearing based at least in part on the sound pressure level. For example, the sound quality device may determine that damage may occur if the sound pressure level is greater than a threshold value. In other cases, the sound quality device may monitor or record the sound pressure level over time and determine that damage may occur when the sound pressure level is above one or more threshold for a predetermined period of time. For example, the sound quality device may monitor the sound pressure level over time based on the OSHA guidelines.

At 814, the sound quality device may alert the user to the potential for hearing damage. For example, the sound quality device may cause the audio source or other device in wireless communication to generate a visual, audible or tactile notification that may alter the user to the potential for hearing damage.

In some alternative implementations, the sound quality device may provide the voltage and current to a device, such as the audio source, in communication with the sound quality device. The other device may then calculate the sound pressure level on behalf other sound quality device and alert the user via an audible, tactile, or visual notification at the device.

At 816, the sound quality device may adjust a resistive value associated with the audio path to reduce the sound pressure level. For example, in lieu of or in addition to alerting the user as to the potential for hearing damage the sound quality device may insert a higher resistive value into the audio path of the audio signal to thereby reduce the sound pressure level of the sound generated by the output device.

Figure 10:
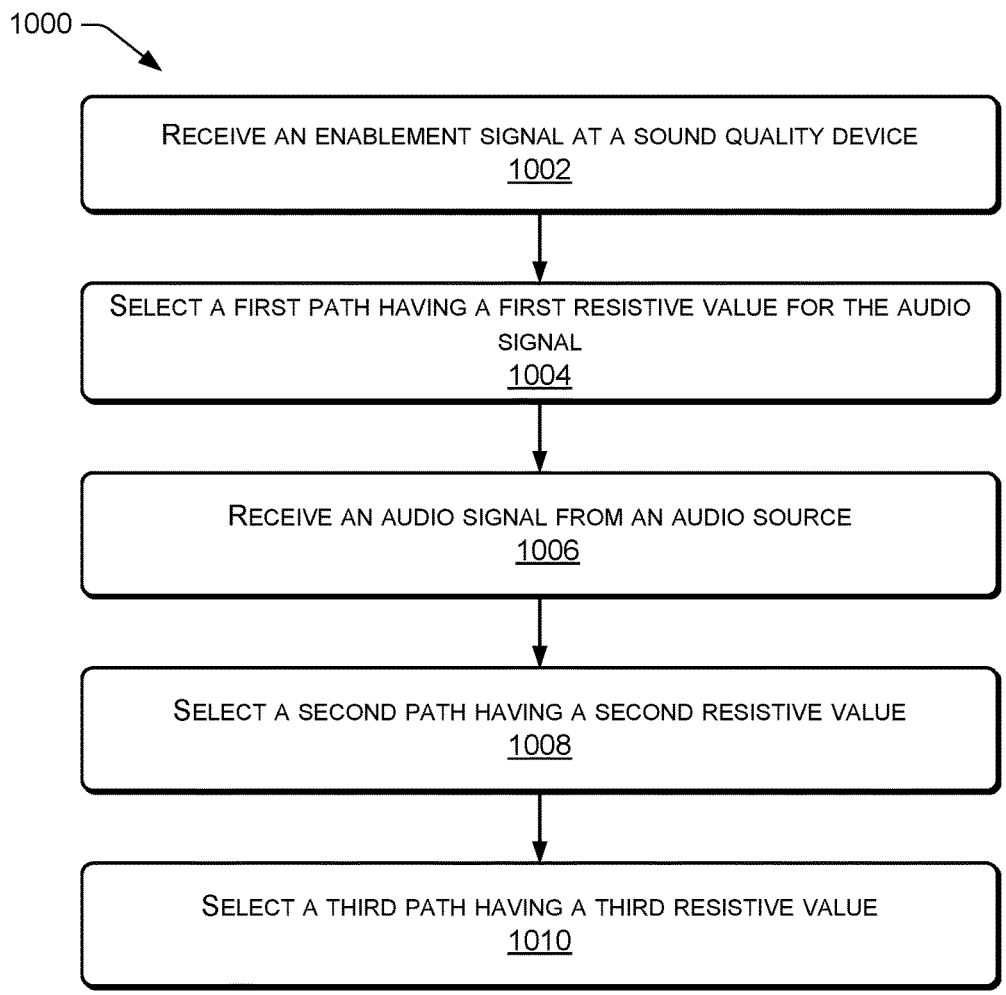
FIG. 10 is an example flow diagram showing an illustrative process according to some implementations.

FIG. 10 is an example flow diagram showing an illustrative process 1000 according to some implementations. For example, the sound quality device may act as a scream protection device. When switching audio signals or, for instance tracks or albums at the audio source, the volume level associated with the audio signal may differ. In these cases, the sound quality device may switch to a high resistive path for a predetermined amount of time upon the activation of the device, receiving a new or different audio signal, or at any time the sound pressure level exceeds a threshold.

At 1002, the sound quality devise receives an enablement signal form the audio source. In some cases, the enablement signal may be a signal indicating the audio source has been activated. In other cases, the enablement signal may be an indication that a new track or new audio signal has been selected for output by the output device. In still other cases, the enablement signal may be the audio signal itself.

At 1004, the sound quality device selects a first path for the audio signal. The first path may have a high resistive value in order to reduce the sound pressure level to a safe level. In some cases, the sound quality device may select the first path in response to receiving the enablement signal.

At 1006, the sound quality device receives an audio signal from the audio source. For example, the sound quality device may continue to receive the audio signal or being to receive the audio signal following the enablement signal.

At 1008, the sound quality device selects a second path for the audio signal. The second path may have a resistive value lower than the first path. In this manner, the sound quality device may bring the sound generated by the output device closer to the level intended by the settings of the audio source.

At 1010, the sound quality device selects a third path for the audio signal. The third path may have a resistive value lower than the second path. In this manner, the sound quality device may again bring the sound generated by the output device closer to the level intended by the settings of the audio source. In the current example, the sound quality device may return to the lowest resistive path after three switches but in other examples any number of resistive levels may be switched between to bring the sound generated by the output device gradually closer and closer to the audio signal generated by the audio source.

Figure 11:
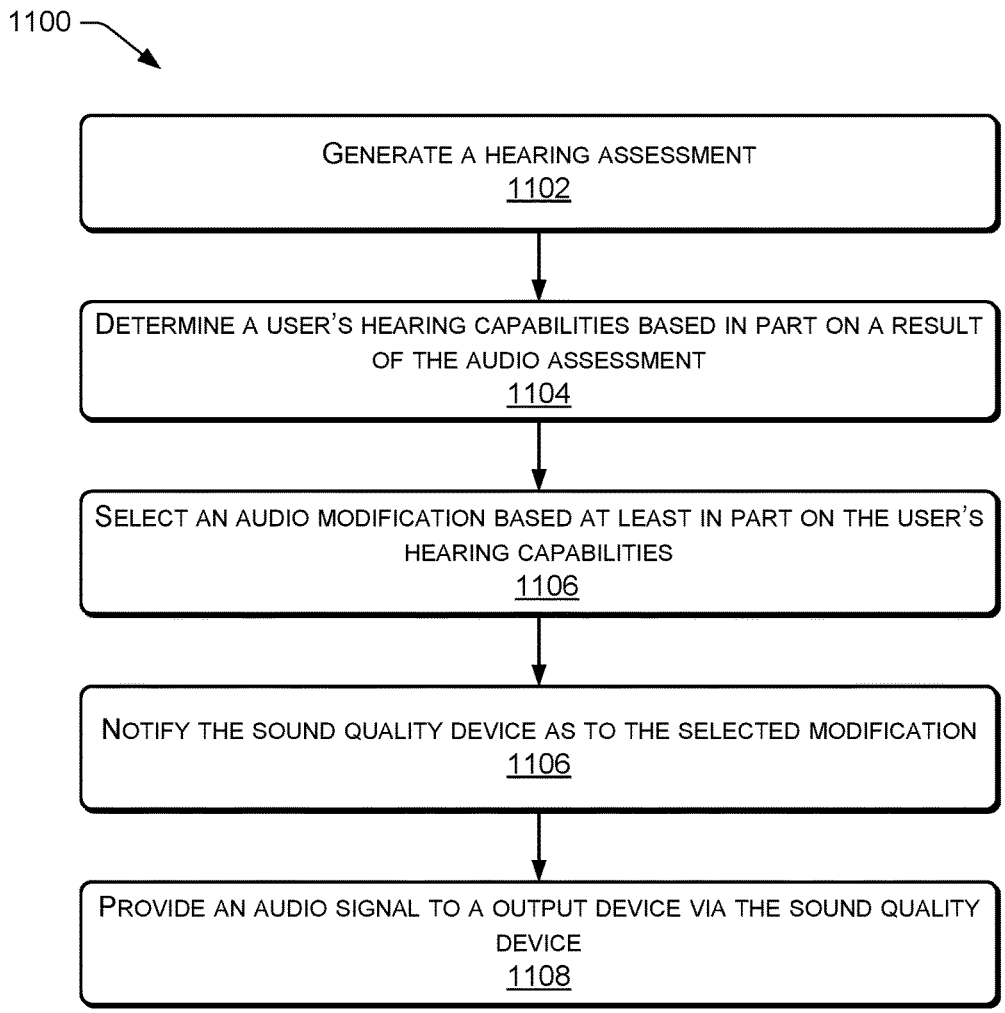
FIG. 11 is an example flow diagram showing an illustrative process according to some implementations.

FIG. 11 is an example flow diagram showing an illustrative process 1100 according to some implementations. In some cases, the sound quality device may be configured to accommodate for the user's particular hearing profile. For example, the sound quality device may include one or more paths that may provide various customized audio settings, as described above with respect to FIGS. 5 and 6. In some implementations, the sound quality device or a sound quality application associated with the sound quality device operating on another device, such as the audio source may cause the user's hearing to be tested.

At 1102, the audio source may generate a hearing assessment. For example, the audio source may generate a number of tones, parts of speech, or sentences with known characteristics. In response to each tone, part of speech, or sentences generated the audio source may receive a user input. Based at least in part on the user inputs and the known characteristics, the sound quality application on the audio source may determine the hearing result of the user.

At 1102, the sound quality application operating on the audio source may determine the user's hearing capabilities based at least in part on the results of the audio assessment. For example, the sound quality application may determine the user has low-end, mid-range, or high-end hearing loss. In other cases, the sound quality application may measure the extent of loss over various frequency bands.

At 1104, the sound quality application may select an audio modification based at least in part on the user's hearing capabilities. For example, the sound quality device may include multiple paths that may alter or modify the audio signal in some manner (for instance, the path described above with respect to FIG. 6 lowers the low and high end frequency bands of the audio signal).

At 1106, the sound quality application may cause the host device to notify the sound quality device as to the selected modification. For example, the host device and the sound quality device may be in communication via a short range wireless communication protocol or a near field wireless network.

At 1108, the host device may provide an audio signal to an output device via the sound quality device. For instance, when the host device is the audio device of FIGS. 1-5, the host device may provide both the selected modification and the audio signal.

Figure 12:
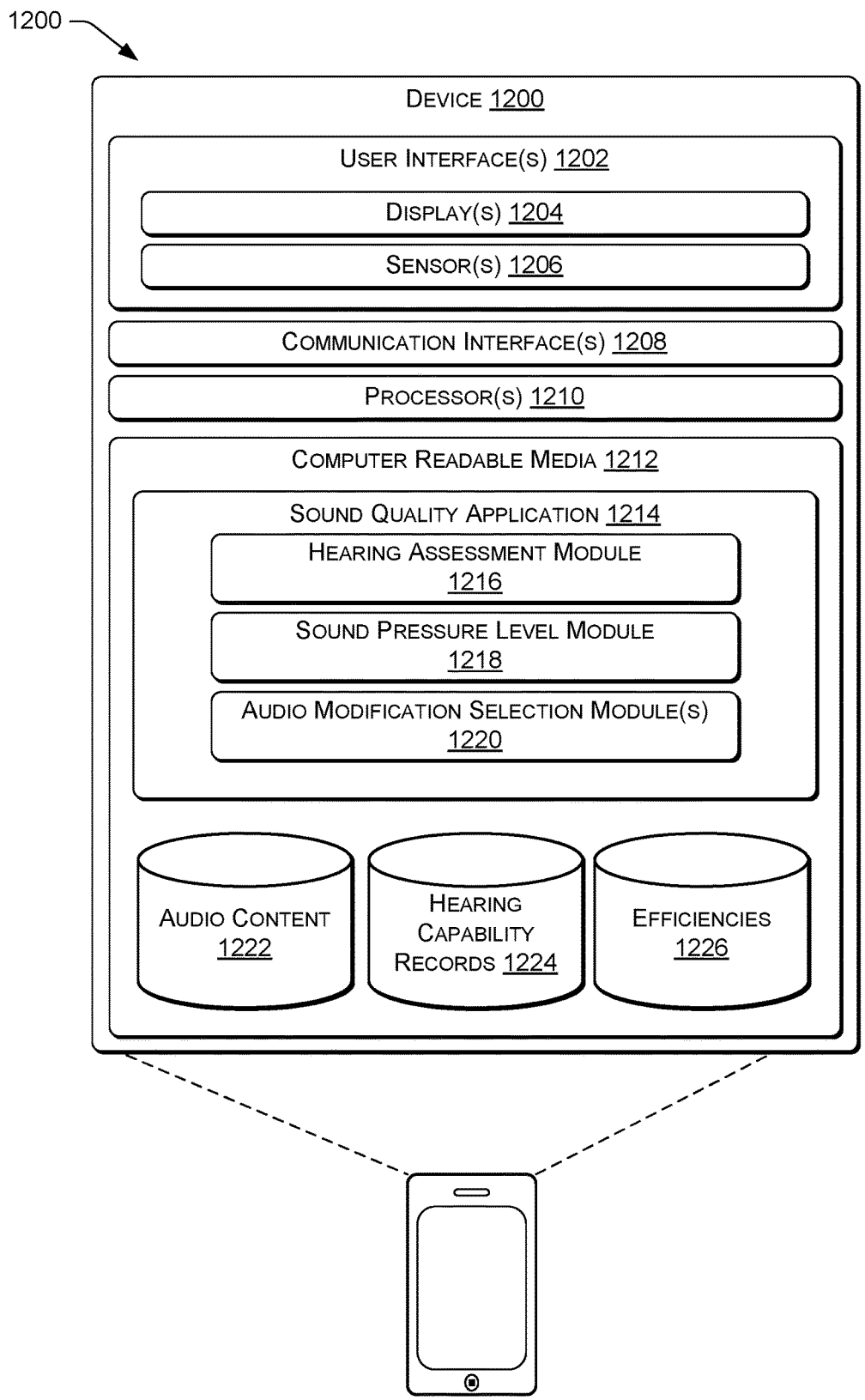
FIG. 12 illustrates an example architecture of an audio device of FIGS. 1-5 according to some implementations.

FIG. 12 illustrates an example architecture of an audio device 1200 of FIGS. 1-5 according to some implementations. In some implementations, the audio device may host or include a sound quality application associated with a sound quality device. For example, the audio device may be a cellular telephone, smart phone, portable media player, tablet computer, wearable computer, laptop computer, netbook, desktop computer, television, appliance, home electronic device, automotive electronic device, augmented reality device, and so forth.

The device 1200, generally, includes one or more user interfaces 1202 for presenting information or data and for receiving user inputs. The user interfaces 1202 may include one or more output components, such as a display or touch screen, and one or more input components, such as keyboards, keypads, joysticks, a mouse, a touch screen, touch pad, drawing pad, or control buttons. In some implementations, the output components and input components are combined in a single user interface 1202 to provide a touch-sensitive display, or touch screen display. For instance, in the illustrated example, the user interface 1202 includes one or more displays 1204 for presenting information, such as data related to a hearing assessment or selectable options associated with an audio track, to a user, one or more sensors 1206 for accepting input resulting from contact and/or application of incident force, such as a user finger or stylus pressing upon one of the sensor 1206. In some specific implementations, the device 1200 may be configured to receive user inputs by communicating with an active stylus or other remote control device. For example, the active stylus and the device 1200 may actively exchange data related to the user inputs.

In some cases, the sensors 1206 may be a touch sensor couple to a touch layer (not shown), such as an indium tin oxide (ITO) layer arranged in a grid pattern below the top surface of the display 1204. In this case, the touch sensor is configured to determine characteristics of user interaction with the display 1204 detected by the ITO layer. These characteristics may include the location of the touch on the display 1204, magnitude of the force, shape of the touch, and so forth.

In some implementations, the display 1204 may present content in a human-readable format to a user. The display 1204 may be reflective, emissive, or a combination of both. Reflective displays utilize incident light and include electrophoretic displays, interferometric modulator displays, cholesteric displays, and so forth. Emissive displays do not rely on incident light and, instead, emit light. Emissive displays include backlit liquid crystal displays (LCDs), time multiplexed optical shutter displays, light emitting diode (LED) displays, and so forth. When multiple displays are present, these displays may be of the same or different types. For example, one display may be an electrophoretic display while another may be a liquid crystal display. In some implementations, multiple displays 1204 may be present and/or coupled to the device 1200. These multiple displays 1204 may be located in the same or different enclosures or panels.

The device 1200 also includes one or more communication interfaces 1208 to facilitate communication between one or more networks (such as the Internet® or one or more local area networks), directly with one or more devices (such as a sound quality device), and/or with one or more cloud services (such as an audio streaming service). The communication interfaces 1208 may also facilitate communication between one or more wireless access points, a master device, and/or one or more other computing devices as part of an ad-hoc or home network system. The communication interfaces 1208 may support both wired and wireless connection to various networks, such as cellular networks, radio, WiFi networks, short-range or near-field networks (e.g., Bluetooth®), infrared signals, local area networks, wide area networks, the Internet, and so forth.

The device 1200 includes or accesses components such as at least one or more control logic circuits, central processing units, or processors 1210, and one or more computer-readable media 1212 to perform the function of the device 1200. Additionally, each of the processors 1210 may itself comprise one or more processors or processing cores.

Depending on the configuration of the device 1200, the computer-readable media 1212 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 1210.

Various instruction, information, data stores, and so forth may be stored within the computer-readable media 1212 and configured to execute on the processors 1210. For instance, the computer-readable media 1212 may store one or more applications, such as a sound quality application 1214). In some cases, the sound quality application 1214 may include instructions which when executed by the processors 1210 cause the device 1200 to improve the user's listening experience. For example, in the illustrated example, the sound quality application 1214 may include a hearing assessment module 1216, a sound pressure level module 1218, and/or an audio modification selection module 1220.

The computer-readable media 1212 may also store various data associated with the sound quality application 1214. For example, the computer-readable media 1212 may store audio content 1222 to provide to the output device, hearing capabilities records 1224, and/or various efficiencies associated with different output devices.

In some cases, the hearing assessment module 1216 may be configured to generate various tones, signals, parts of speech, etc. at the device 1200 and to send the various tones, signals, parts of speech, etc. to an output device for output as sound. The hearing assessment module 1216 may also be configured to receive user inputs, for instance, via the user interface 1202 in response to the output of the tones, signals, parts of speech, etc. In this manner, the hearing assessment module 1216 may determine the user's hearing capabilities 1224.

The sound pressure level module 1218 may be configured to receive data such as various sampled voltages and measured currents from a sound quality device via the communication interfaces 1208. The sound pressure level module 1218 may then be able to calculate the sound pressure level of the sound generated by the output device using the received voltages and current as well as the stored efficiencies 1226. The sound pressure level module 1218 may also measures the user's exposure to the sound pressure level over time. In some cases, the sound pressure level module 1218 may alter the user via the user interfaces 1208 if the user is exposed to potential hearing damage. In other cases, the sound pressure level module 1218 may cause the sound quality device to alter a resistive value associated with the audio path of the audio signal in order to reduce the sound pressure level when there is potential for hearing damage.

In another example, the sound pressure level module 1218 may receive a request from the sound quality device via the communication interfaces 1208. The sound pressure level module 1218 may request the user select an identifier associated with the output device (e.g., a make and model). The sound quality device may then determine the efficiency 1226 of one or more speakers of the output device based at least in part on the identifier selected by the user. The sound pressure level module 1218 may cause the communication interface 1208 to send the efficiency 1226 to the sound quality device for further processing.

The audio modification selection module 1220 may be configured determine if a modification to the audio signal by the sound quality device may improve the listening experience of the user. For example, the audio modification selection module 1220 may select the audio modification based at least in part on the user's hearing capability records 1224. The audio modification selection module 1220 may also send the audio modification to the sound quality device via the communication interface 1208.

Figure 13:
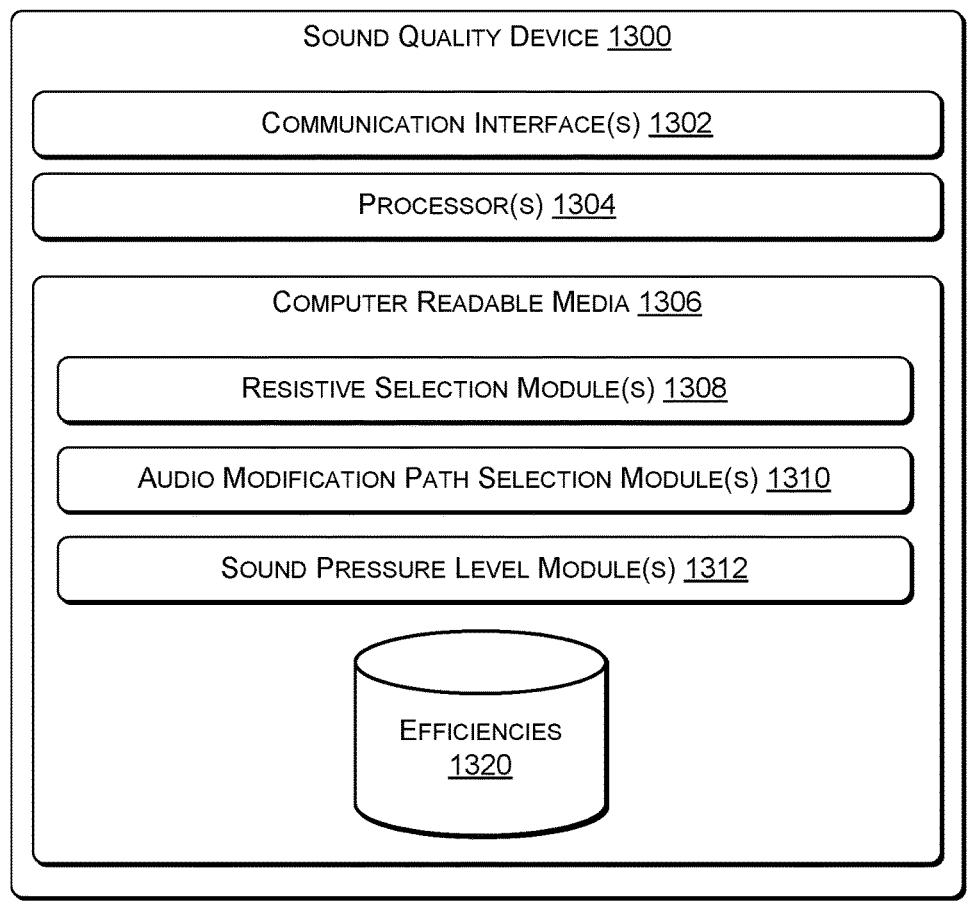
FIG. 13 illustrates an example architecture of a sound quality device of FIGS. 1-5 according to some implementations.

FIG. 13 illustrates an example architecture of a sound quality device 1300 of FIGS. 1-5 according to some implementations. The sound quality device 1300 may be coupled between an audio source and an output device to monitor the sound pressure level of the sound generated by the output device in real time. The sound quality device may also be configured to notify the user if the sound pressure level presents a danger to the user's hearing. In some particular implementations, the sound quality device may also reduce or lower the sound pressure level without affecting the volume associated with the audio signal.

The sound quality device 1300 includes one or more communication interfaces 1302 to facilitate communication between one or more networks (such as the Internet® or one or more local area networks), directly with one or more devices (such as the audio source or the device 1200 of FIG. 12), and/or with one or more cloud services (such as the foreign language acquisition system). The communication interfaces 1302 may also facilitate communication between one or more wireless access points, a master device, and/or one or more other computing devices as part of an ad-hoc or home network system. The communication interfaces 1302 may support both wired and wireless connection to various networks, such as cellular networks, radio, WiFi networks, short-range or near-field networks (e.g., Bluetooth®), infrared signals, local area networks, wide area networks, the Internet, and so forth.

The sound quality device 1300 includes or accesses components such as at least one or more control logic circuits, central processing units, or processors 1304, and one or more computer-readable media 1306 to perform the function of the device 1300. Additionally, each of the processors 1304 may itself comprise one or more processors or processing cores.

Depending on the configuration of the device 1300, the computer-readable media 1306 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 1304.

Various instruction, information, data stores, and so forth may be stored within the computer-readable media 1306 and configured to execute on the processors 1304. For instance, the computer-readable media 1306 may store a resistive selection module 1308, an audio modification path selection module 1310, or a sound pressure level module 1312. The computer-readable media 1306 may also store a table of efficiencies 1314 that may be used to determine the sound pressure level.

The resistive selection module 1308 may be configured to switch between resistive paths to reduce the sound pressure level of the sound generated by the output device. The audio modification path selection module 1310 may be configured select an audio modification to accommodate for the hearing capabilities of the user, as described above with respect to FIG. 5.

The sound pressure level module 1312 may be configured to sample the voltage of the audio signal at various points. Using the sampled voltages, the sound pressure level module 1312 may calculate the current of the audio signal. The sound pressure level module 1312 may also measure an impedance of the audio signal and infer or look up an efficiency 1320 in the computer-readable media 1306.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A device comprising:
   an input interface releasably coupled to an audio source, the input interface configured to receive an audio signal;
   an output interface releasably coupled to an output device to send the audio signal to the output device;
   a path associated with the audio signal, the path having:
      a first point;
      a resistive element positioned after the first point; and
      a second point positioned after the resistive element;
   a circuit to:
      determine a first voltage associated with the audio signal at the first point;

determine a second voltage associated with the audio signal at the second point;

determine a current associated with the audio signal based at least in part on the first voltage and the second voltage;

determine a sound pressure level associated with the audio signal based at least in part on the second voltage and the current; and cause a switch to couple to the second point based at least in part on the second voltage and the current.

2. The device as recited in claim 1, wherein the sound pressure level is based at least in part on a predetermined efficiency.

3. The device as recited in claim 1, further comprising:
a computer readable media accessible to the circuit, the computer readable media storing a plurality of efficiencies; and
wherein the sound pressure level is based at least in part on one of the plurality of efficiencies.

4. The device as recited in claim 1, further comprising:
a communication interface accessible to the circuit, the communication interface for receiving an efficiency; and
wherein the sound pressure level is based at least in part on the efficiency.

5. The device as recited in claim 1, further comprising:
a communication interface accessible to the circuit; and
wherein the circuit causes the communication interface to send a signal to a device to cause the device to generate an alert in response to determining that the sound pressure level is greater than a threshold.

6. The device as recited in claim 1, further comprising:
a communication interface accessible to the circuit; and
wherein the circuit causes the communication interface to send a signal to a device to cause the device to generate an alert in response to determining that the sound pressure level is greater than a threshold for greater than a predetermined amount of time.

7. A circuit comprising:
a path for an audio signal, the path having a first point and a second point;
a first restive element having a first electrode coupled to the first point and a second electrode coupled to the second point;
a first analog-to-digital converter coupled to the first point;
a second analog-to-digital converter coupled to the second point;
a processor coupled to the first analog-to-digital converter and the second analog-to-digital converter; and
a computer-readable media having computer-executable instructions that, when executed by the processor, causes the processor to:
identify a first voltage associated with the audio signal at the first point;
identify a second voltage associated with the audio signal at the second point;
determine a current based at least in part on the first voltage and the second voltage;
determine a sound pressure level based at least in part on the second voltage and the current; and
cause a switch to couple to the second point based at least in part on the second voltage and the current.

8. The circuit as recited in claim 7, wherein the sound pressure level is based at least in part on a predetermined efficiency.

9. The circuit as recited in claim 7, wherein
the computer readable media stores a plurality of efficiencies; and
the sound pressure level is based at least in part on one of the plurality of efficiencies.

10. The circuit as recited in claim 7, further comprising:
a communication interface coupled to the processor, the communication interface for receiving an efficiency; and
wherein the sound pressure level is based at least in part on the efficiency.

11. The circuit as recited in claim 7, further comprising:
a communication interface coupled to the processor; and
wherein the computer-readable media has additional computer-executable instructions that, when executed by the processor, causes the processor to:
determine that the sound pressure level is greater than a threshold; and
cause the communication interface to alert a device.

12. The circuit as recited in claim 7, further comprising:
a communication interface coupled to the processor; and
wherein the computer-readable media has additional computer-executable instructions that, when executed by the processor, causes the processor to:
determine that the sound pressure level is greater than a threshold for greater than a predetermined amount of time; and
cause the communication interface to alert a device.

13. The circuit as recited in claim 7, further comprising;
the switch coupled between the second electrode of the first resistive element and the second point;
a second resistive element having a first electrode coupled to the first point and a second electrode; and
wherein the computer-readable media has additional computer-executable instructions that, when executed by the processor, causes the processor to:
determine that the sound pressure level is greater than a threshold; and
cause the switch to decouple from the second electrode of the first resistive element and to couple to the second electrode of the second resistive element.

14. The circuit as recited in claim 13, wherein a resistive value of the first resistive element is less than a resistive value of the second resistive element.

15. The circuit as recited in claim 7, further comprising;
an audio modification component coupled between the second electrode of the first resistive element and the second.

16. The circuit as recited in claim 7, further comprising:
the switch coupled having a first electrode coupled to the second point;
a first audio modification component releasably coupled to the switch;
a second audio modification component releasably coupled to the switch;
wherein the computer-readable media has additional computer-executable instructions that, when executed by the processor, causes the processor to:
receive a first signal associated with a hearing capability of a first user; and
cause the switch to couple to the first audio modification component based at least in part on the hearing capability of the first user;
receive a second signal associated with a hearing capability of a second user; and cause the switch to couple to the second audio modification component based at least in part on the hearing capability of the second user.

17. A device comprising:
an input interface releasably coupled to an audio source, the input interface configured to receive an audio signal;
an output interface releasably coupled to an output device to send the audio signal to the output device;
a communication interface to receive first data associated with the audio signal from a control device;
a first path associated with the audio signal, the path having:
  a first point;
  a resistive element on the first path after the first point; and
  a second point on the first path after the resistive element;
a second path, having a first resistive value;
a third path, having a second resistive value;
a switch to couple to either the second path or the third path;
a circuit to:
  receive second data associated with the audio signal at the first point;
  receive third data associated with the audio signal at the second point;
  determine an estimated impedance based at least in part on the first data, the second data, and the third data; and
  cause the switch to couple to the second path based at least in part on the estimated impedance.

18. The device as recited in claim 17, wherein:
the communication interface receives fourth data associated with a second audio signal; and
the circuit is configured to:
  receive fifth data associated with the second audio signal at the first point;
  receive sixth data associated with the second audio signal at the second point;
  determine a second estimated impedance based at least in part on the fourth data, the fifth data, and the sixth data; and
cause the switch to couple to the third path based at least in part on the second estimated impedance.

19. The device as recited in claim 17, further comprising a fourth path, having a resistive value different than the second path and the third path and wherein:
the switch is configured to couple to the fourth;
the communication interface receives fourth data associated with a second audio signal; and
the circuit is configured to:
  receive fifth data associated with the second audio signal at the first point;
  receive sixth data associated with the second audio signal at the second point;
  determine a second estimated impedance based at least in part on the fourth data, the fifth data, and the sixth data; and
cause the switch to couple to the fourth path based at least in part on the second estimated impedance.

20. The device as recited in claim 19, wherein the control device is the audio source.

* * * * *